US007986290B2

(12) United States Patent
Yang

(10) Patent No.: US 7,986,290 B2
(45) Date of Patent: Jul. 26, 2011

(54) OUTPUT STAGE AND RELATED LOGIC CONTROL METHOD APPLIED TO SOURCE DRIVER/CHIP

(75) Inventor: Cheng-Yong Yang, Taipei (TW)

(73) Assignee: Faraday Technology Corp., Science-Based Industrial Park, Hsin-Chu (TW)

( * ) Notice: Subject to any disclaimer, the term of this patent is extended or adjusted under 35 U.S.C. 154(b) by 735 days.

(21) Appl. No.: 12/124,397

(22) Filed: May 21, 2008

(65) Prior Publication Data

US 2008/0291598 A1 Nov. 27, 2008

(30) Foreign Application Priority Data

May 23, 2007 (TW) ................................ 96118451 A

(51) Int. Cl.
*H02H 11/00* (2006.01)
*H03K 19/094* (2006.01)

(52) U.S. Cl. .......................................... 345/87; 345/100

(58) Field of Classification Search ............. 345/87–104
See application file for complete search history.

(56) References Cited

U.S. PATENT DOCUMENTS 6,894,665 B1 * 5/2005 Zimlich ........................... 345/76
7,133,013 B2 * 11/2006 Kamezaki et al. .............. 345/98
2004/0169543 A1 * 9/2004 Doutreloigne et al. ........ 327/333

* cited by examiner

*Primary Examiner* — Richard Hjerpe
*Assistant Examiner* — Jeffrey Steinberg
(74) *Attorney, Agent, or Firm* — Winston Hsu; Scott Margo

(57) ABSTRACT

Output stage and related method applied to source driver/chip of LCD panel. While performing dot polarization inversion for even/odd channels of LCD panel, n-channel and p-channel MOS transistors of symmetric layout are respectively adopted for alternately transmitting a positive polarization signal of higher swing range and a negative polarization signal of lower swing range from corresponding drivers of asymmetric layout to the even/odd channels, such that a layout area for alternating polarizations can be reduced. Also, the invention directly ties inputs of the output drivers to $V_{DD}$ or $V_{SS}$ so as to turn off the drivers for providing high impedance at the even/odd channels when necessary.

14 Claims, 5 Drawing Sheets

OUTPUT STAGE AND RELATED LOGIC CONTROL METHOD APPLIED TO SOURCE DRIVER/CHIP

FIELD OF THE INVENTION

The present invention relates to an output stage and a related method for use in a source driver/chip of an LCD panel, and more particularly to an output stage and a related method which use only n-channel/p-channel MOS transistors for alternately transmitting negative/positive polarization driving inputs in a dot polarization inversion mechanism, such that a layout area can be reduced, and turn off the output driving circuit for providing high impedance when necessary.

BACKGROUND OF THE INVENTION

A liquid crystal display (LCD) has become one of the most popular displaying devices nowadays. Thus circuits and means for driving LCD panels are one of the key techniques to be researched and developed in modern electronic industry. Give a thin-film transistor LCD (TFT-LCD) panel for example. A TFT-LCD panel generally includes a plurality of pixel units arranged in an array; and each TFT-LCD pixel unit typically includes a thin-film transistor and a LC light valve. Gates of the thin-film transistors in the same row of the array are interconnected to a common row line, which is so-called as a scan line, while their sources are connected to respective column lines, which are so-called as data lines. The row lines are driven by gate drivers/chips while source drivers/chips are used for driving column lines.

Generally speaking, a thin-film transistor, when turned on, may transmit a driving voltage provided by the source chip to a corresponding light valve so as to rotate LC molecules in the light valve, thereby adjusting light transmittance through the light valve. Accordingly, different levels of brightness and colors can be shown, depending on the driving voltages. The driving voltages of respective light valves, on the other hand, are adjusted according to the corresponding data to be displayed in order to show desired image on the display panel. Considering physical properties of LC molecules, two kinds of driving voltages may result in the same level of rotation for the LC molecules in the same light valve. The higher one is defined as a positive polarization driving voltage, while the lower one is defined as a negative polarization driving voltage. Even though the levels of the positive polarization driving voltage and the negative polarization driving voltage are different, both of them enable a pixel unit to show substantially the same gray level or color.

For avoiding damage, lengthening life span and alleviating image retention of a LCD panel, source drivers/chips alternately drives respective columns with positive polarization driving voltages and the negative polarization driving voltages. Assuming the source chip drives a specified odd output line with a positive polarization power and drives an adjacent even output line with a negative polarization power, the positive/negative polarizations will be switched in next image-updating period. That is, a negative polarization power is used for driving the odd output line and a positive polarization power is used for driving the even output line. For achieving this purpose, dot polarization inversion is required by the source chip.

Please refer to FIG. 1. An output stage 12 of a source chip 10 is biased between operational voltages $V_{DD}$ and $V_{SS}$. For driving a specified odd output line and an adjacent even output line through a pair of odd and even output channels, respectively, two output circuits 14A and 14B are disposed in the output stage 12 of the source chip 10. A pair of data to be displayed are inputted into the output circuits 14A and 14B and then transmitted to the specified odd output line and the adjacent even output line. As illustrated in the figure, the input signal having a lower swing range, e.g. lying between $V_{DD}/2$ and $V_{SS}$, is inputted into the output circuit 14A to be converted into a negative polarization driving voltage and then outputted at a node Np1. On the other hand, the input signal having a higher swing range, e.g. lying between $V_{DD}$ and $V_{DD}/2$, is inputted into the output circuit 14B to be converted into a positive polarization driving voltage and then outputted at a node Np2. The output stage 12 further includes transmission gates TRn1, TRn2, TRp1 and TRp2 controlled by two reverse-phased control signals pol and polb to implement dot polarization inversion.

When the control signal pol is at a high level while the control signal polb is at a low level, the transmission gates TRn1 and TRp1 are turned on while the transmission gates TRn2 and TRp2 are turned off. Accordingly, the negative polarization driving voltage outputted from the output circuit 14A may be transmitted to the odd output channel, and the positive polarization driving voltage outputted from the output circuit 14B may be transmitted to the even output channel. While updating the image on the display panel, the control signal pol is switched to a low level and the control signal polb is switched to a high level so that the TRn2 and TRp2 are turned on and the transmission gates TRn1 and TRp1 are turned off. Then it becomes that the negative polarization driving voltage outputted from the output circuit 14A is transmitted to the even output channel, but the positive polarization driving voltage outputted from the output circuit 14B is transmitted to the odd output channel, thereby achieving polarization inversion for driving.

The above-mentioned prior art has the following drawbacks. The conventional dot polarization inversion mechanism is implemented with a plurality of transmission gates, and each of the transmission gates includes a pair of n-channel and p-channel MOS transistors. It is apparent that the layout size is undesirably large and the integrity is unsatisfactory. In addition, when no driving voltage is to be outputted by the output circuit, the output circuit in the output stage is supposed to provide high impedance at the output channels. The high-impedance requirement possibly has an effect on the features of the output circuit, e.g. changing the zero point of the output impedance frequency response. Moreover, since the driving power in the output stage is of high voltage and high current, the life span of transistors might be adversely affected. The resistance of transistors to electrostatic discharge (ESD) is also an issue to be carefully considered, particularly for the small transistors. Therefore, a better balance between layout size and circuit properties has been being sought.

SUMMARY OF THE INVENTION

Therefore, the present invention provides an output stage and related method/technique applied to a source driver/chip of an LCD panel to solve the above problems.

One of the objects of the present invention is to provide an output stage for a source driver/chip. The output stage includes an odd output channel and an even output channel, a first output circuit and a second output circuit, and a plurality of first-type transistors (e.g. n-channel MOS transistors) and second-type transistors (e.g. p-channel MOS transistors). The first output circuit (e.g. a negative polarization output circuit) can provide a first output signal (e.g. serving as a negative polarization driving voltage) at a first node according to a first input signal (e.g. an input signal with a relatively low swing range). The second output circuit (e.g. a positive polarization output circuit) can provide a second output signal (e.g. serving as a positive polarization driving voltage) at a second node according to a second input signal (e.g. an input signal with a relatively high swing range).

Furthermore, the plurality of first-type transistors and second-type transistors are used for performing a dot polarization inversion switching mechanism. One of the first-type transistors is coupled between the first node and the odd output channel so that the first output signal is transmitted to the odd output channel via the first-type transistor without passing through any of the second-type transistors; another one of the first-type transistors is coupled between the first node and the even output channel so that the first output signal is transmitted to the even output channel via the first-type transistor without passing through any of the second-type transistors; one of the second-type transistors is coupled between the second node and the odd output channel so that the second output signal is transmitted to the odd output channel via the second-type transistor without passing through any of the first-type transistors; and another one of the second-type transistors is coupled between the second node and the even output channel so that the second output signal is transmitted to the even output channel via the second-type transistor without passing through any of the first-type transistors. In other words, in a negative polarization output circuit of the present invention, only n-channel MOS transistors are used for controlling polarization switching so as to alternately outputting a negative polarization driving voltage to the odd output channel or the even output channel. On the other hand, in a positive polarization output circuit of the present invention, only p-channel MOS transistors are used for controlling polarization switching so as to alternately outputting a positive polarization driving voltage to the odd output channel or the even output channel.

In the above structure of output stage, when dot polarization inversion is performed, the first-type transistors coupled between the first node and the odd output channel and the first-type transistors coupled between the first node and the even output channel are not turned on at the same time, and the second-type transistors coupled between the second node and the odd output channel and the second-type transistors coupled between the second node and the even output channel are not turned on at the same time. In contrast, for polarization switching, the first-type transistors coupled between the first node and the odd output channel and the second-type transistors coupled between the second node and the even output channel are optionally turned on at the same time; and the first-type transistors coupled between the first node and the even output channel and the second-type transistors coupled between the second node and the odd output channel are optionally turned on at the same time.

Due to a relative low swing range (e.g. voltage swing) of a negative polarization driving voltage, it has been enough to control polarization switching only through n-channel MOS transistors. There is no need of complete transmission gates for controlling polarization switch, which are required in the prior art. Likewise, due to a relative high swing range of a positive polarization driving voltage, it has been enough to control polarization switching only through p-channel MOS transistors, and no prior-art complete transmission gates are needed. Accordingly, the layout size of the polarization switching mechanism can be reduced while the integrity of the source driver or source chip can be improved.

In an embodiment, the first output circuit and the second output circuit are implemented based on an asymmetric device layout specification; and the first-type transistors and second-type transistors are implemented based on a symmetric device layout specification. According to an asymmetric device layout specification, the clearance between the source and gate of a MOS transistor and the clearance between the drain and gate of the MOS transistor are asymmetric or unequal. Such a design may reduce a layout size of the MOS transistor. If the clearance between the source and gate and the clearance between the drain and gate are symmetric or equal, the layout size is larger. Nevertheless, a larger layout size has a better resistance to high voltage and high current as well as electrostatic discharge (ESD). Therefore, it is desired to use transistors with asymmetric layouts in a front section of the output stage, but use transistors with symmetric layout in the last section of the polarization switching mechanism. In this way, a good balance between the layout size and the circuit integrity/durability can be achieved.

In an embodiment, the first output circuit includes a first stacking circuit and a first output driver. The first stacking circuit outputs a corresponding signal from at least one front-stage output end according to the first input signal. The first output driver is coupled between the first stacking circuit and the first node. The first output driver has at least one driving input end. Each driving input end corresponds to a front-stage output end of the first stacking circuit. For providing high impedance when necessary, the first output circuit further includes at least one switching circuit. Each of the switching circuits is coupled between a front-stage output end and a corresponding driving input end and optionally conducts the front-stage output end coupled thereto to the corresponding driving input end so that the first output driver selectively outputs the first output signal from the first node or connects the driving input end to a corresponding preset voltage (e.g. operational voltage of the output stage) to provide high impedance at the first node.

Likewise, in an embodiment, the second output circuit includes a second stacking circuit and a second output driver. The second stacking circuit outputs a corresponding signal from at least one front-stage output end according to the second input signal. The second output driver is coupled between the second stacking circuit and the second node. The second output driver has at least one driving input end. Each driving input end corresponds to a front-stage output end of the first stacking circuit. For providing high impedance when necessary, the second output circuit further includes at least one switching circuit. Each of the switching circuits is coupled between a front-stage output end and a corresponding driving input end and optionally conducts the front-stage output end coupled thereto to the corresponding driving input end so that the second output driver selectively outputs the second output signal from the second node or connects the driving input end to a corresponding preset voltage (e.g. operational voltage of the output stage) to provide high impedance at the second node. Since the present invention adds switching circuits at the driving input end of the output driver, the output impedance feature and the response feature (e.g. zero point) of the output driver itself will not be influenced.

Another object of the present invention is to provide an output stage adapted to be used in a source chip or source driver. The output stage includes: at least one output circuit (e.g. the above-described first and/or second output circuits). Each output circuit has a corresponding output node, and provides a corresponding output signal at the corresponding output node according to a corresponding input signal. Each output circuit includes a stacking circuit, an output driver and at least one switching circuit. The stacking circuit outputs a corresponding signal from at least one front-stage output end according to the input signal; the output driver is coupled between the stacking circuit and the second output node, and having at least one driving input end corresponding to the front-stage output end of the stacking circuit; and each switching circuit is coupled between the front-stage output end and the corresponding driving input end. Each switching circuit conducts the front-stage output end coupled thereto to the corresponding driving input end so that the output driver selectively outputs the output signal (i.e. driving voltage) from the output node or connects the driving input end to a corresponding preset voltage (e.g. operational voltage) to provide high impedance at the output node. For performing polarization switching, the output stage is disposed with first-type transistors (e.g. n-channel MOS transistors) and second-type transistors (e.g. p-channel MOS transistors) to work with the first output circuit with a relative low swing input signal and the second output circuit with a relative high swing input signal. The output node of the first output circuit is coupled to the odd output channel and the even output channel via the first-type transistors so that the output node of the first output circuit is communicable with either of the odd output channel and the even output channel with or without the conduction of any of the second-type transistors; and the output node of the second output circuit is coupled to the odd output channel and the even output channel via the second-type transistors so that the output node of the second output circuit is communicable with either of the odd output channel and the even output channel with or without the conduction of any of the first-type transistors. In this way, the polarization inversion can be achieved.

A further object of the present invention is to provide a method for driving polarization inversion of a first output driver and a second output driver at an odd output channel and an even output channel while performing source driving. The method includes a step of controlling conduction states among the first output driver, the second output driver, the odd output channel and the even output channel with a plurality of first-type transistors and second-type transistors; wherein the first output driver is made communicable with either of the odd output channel and the even output channel by conducting the first-type transistors with or without the conduction of any of the second-type transistors; and the second output driver is made communicable with either of the odd output channel and the even output channel by conducting the second-type transistors with or without the conduction of any of the first-type transistors. As described above, assuming that the first output circuit is used for driving a relative low swing input signal (i.e. negative polarization driving voltage) and the second output circuit with a relative high swing input signal (i.e. positive polarization driving voltage), then the first-type transistors can be n-channel MOS transistors; the second-type transistors can be p-channel MOS transistors. When high impedance is required, connect an input end of the first output driver or the second output driver to a corresponding preset voltage (e.g. operational voltage) to provide high impedance at an output end of the first output driver or the second output driver.

BRIEF DESCRIPTION OF THE DRAWINGS

The above contents of the present invention will become more readily apparent to those ordinarily skilled in the art after reviewing the following detailed description and accompanying drawings, in which.

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only; it is not intended to be exhaustive or to be limited to the precise form disclosed.

Figure 1:
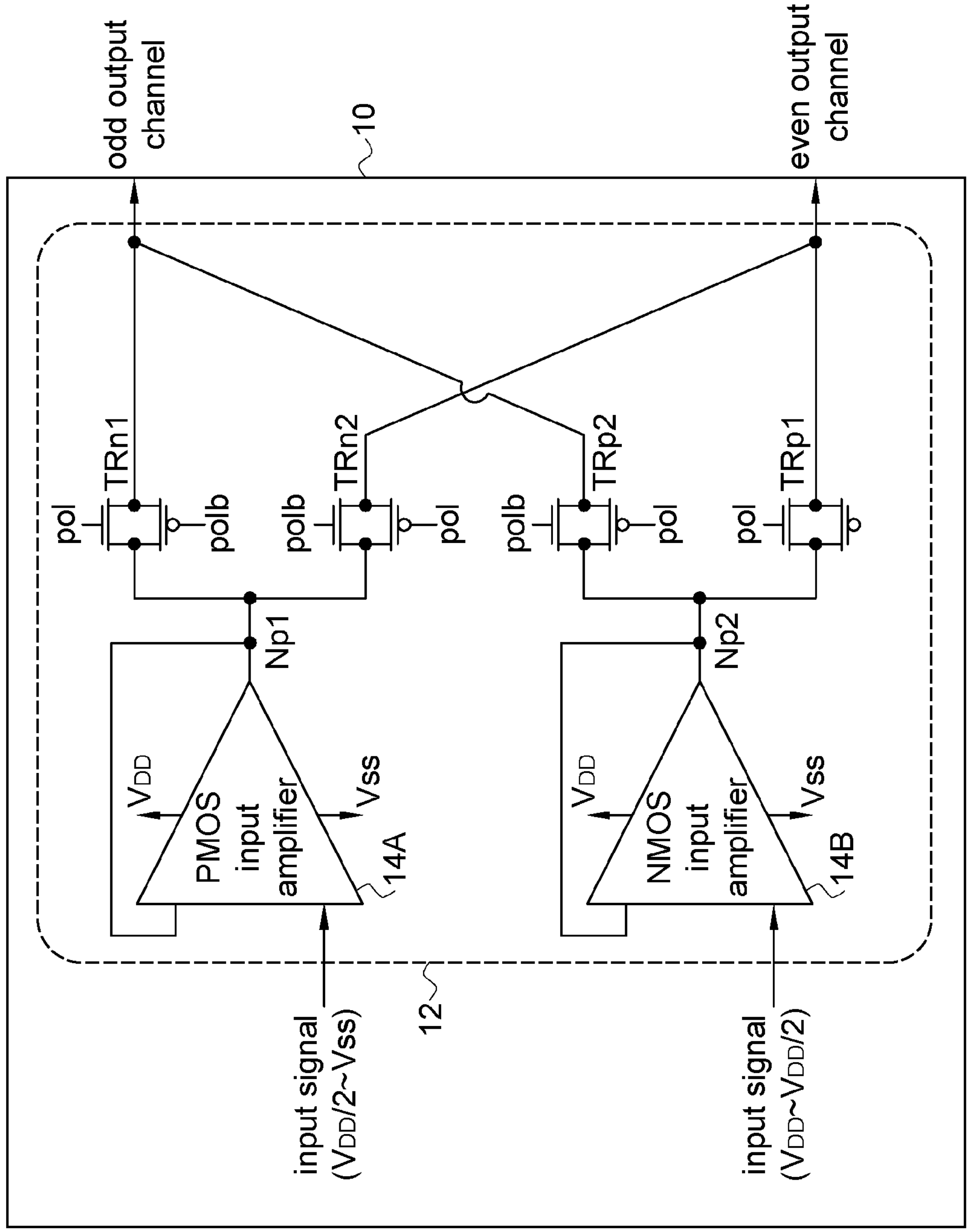
FIG.1 PRIOR ART
FIG. 1 is a circuit diagram illustrating an output stage of a conventional source chip.
Figure 2:
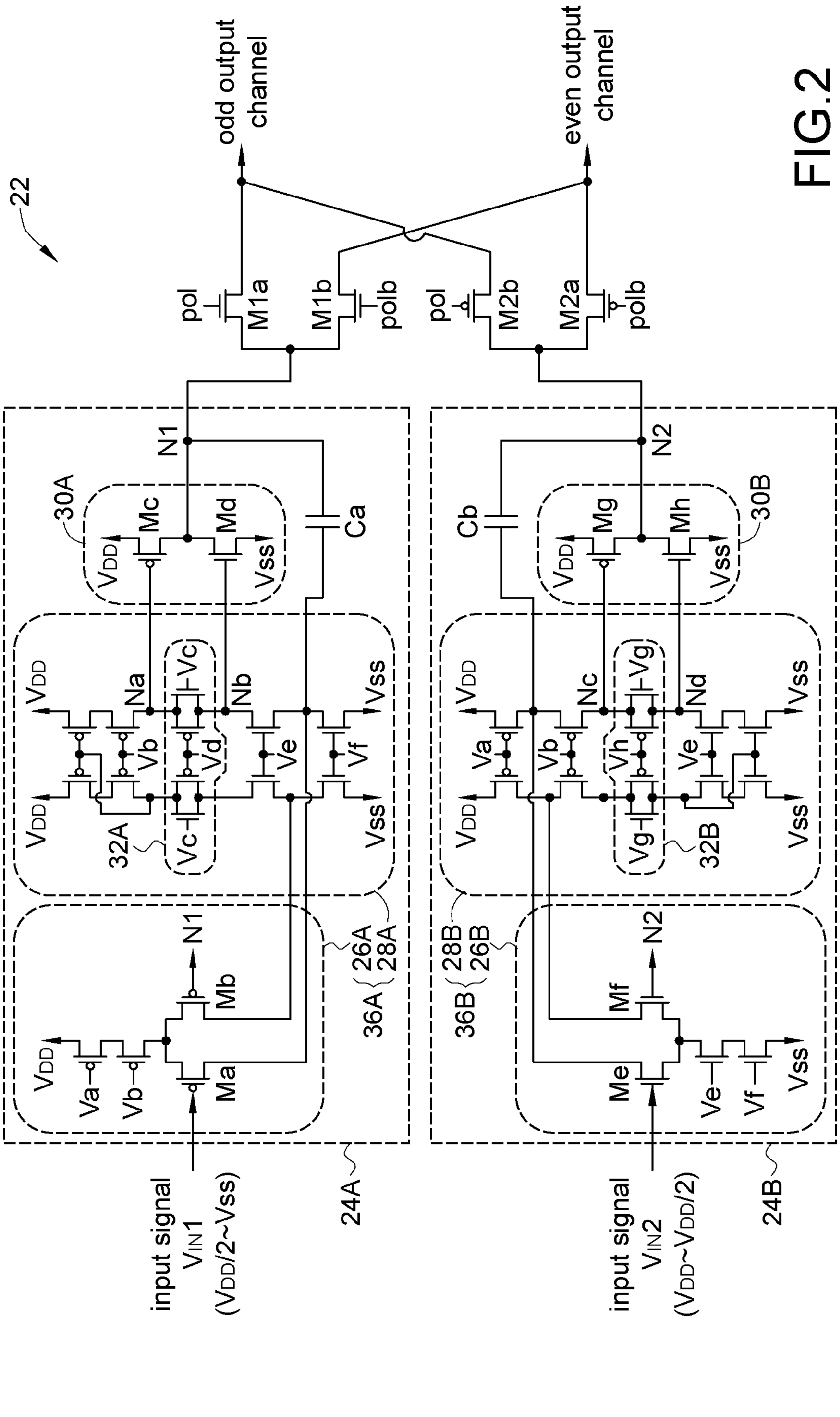
FIG. 2 is a circuit diagram illustrating an output stage of a source chip according to an embodiment of the present invention.

Please refer to FIG. 2, which illustrates circuitry of an embodiment of an output stage 22 according to the present invention. The output stage 22 is applicable to a source driver/chip such as a source chip of an LCD panel for source driving. As shown in FIG. 2, the output stage 22 is biased between operational voltages $V_{DD}$ and $V_{SS}$ and includes first and second output circuits 24A and 24B. The output circuit 24A receives an input signal $V_{IN}$1 within a low swing range, e.g. a range between $V_{DD}/2$ and $V_{SS}$, and drives to generate a negative polarization output signal at an output node N1 with a negative polarization driving voltage. On the other hand, the output circuit 24B receives an input signal $V_{IN}$2 within a high swing range, e.g. a range between $V_{DD}$ and $V_{DD}/2$, and drives to generate a positive polarization output signal at an output node N2 with a positive polarization driving voltage.

For performing dot polarization inversion, the negative/positive polarization driving voltages provided by the output circuits 24A/24B are alternately transmitted to odd and even output channels. The output stage 22 further includes n-channel MOS transistors M1*a* and M1*b*, and p-channel MOS transistors M2*a* and M2*b*. The gates of the transistors M1*a* and M2*b* are controlled by a control signal pol, and the gates of the transistors M2*a* and M1*b* are controlled by a control signal polb, wherein the control signals pol and polb are phase-inversed signals. In this embodiment, the transistor M1*a* is coupled to the node N1 and the odd output channel, while the transistor M1*b* is coupled to the node N1 and the even output channel. Accordingly, the negative polarization output signal (or negative polarization driving voltage) provided by the output circuit 24A may be alternately transmitted to odd/even output channels via n-channel MOS transistors without passing through any p-channel MOS transistor. Likewise, the transistor M2*b* is coupled to the node N2 and the odd output channel, while the transistor M2*a* is coupled to the node N2 and the even output channel. Accordingly, the positive polarization output signal (or positive polarization driving voltage) provided by the output circuit 24B may be alternately transmitted to odd/even output channels via p-channel MOS transistors without passing through any n-channel MOS transistor.

In more detail, when the control signal pol is at a high level and the control signal polb is at a low level, the transistors M1*a* and M2*a* are turned on while the transistors M1*b* and M2*b* are turned off. Thus the negative polarization driving voltage provided at the node N1 by the negative polarization output circuit 24A is transmitted to the odd output channel via the n-channel MOS transistor M1*a*. On the other hand, the positive polarization driving voltage provided at the node N2 by the positive polarization output circuit 24B is transmitted to the even output channel via the p-channel MOS transistor M2*a*. After the polarization has been switched by inverting polarization, e.g. by dot inversion, the control signal pol is switched to a low level while the signal polb is switched to a high level, so as to turn on the transistors M1*b* and M2*b* while turning off the transistors M1*a* and M2*a*. As a result, the negative polarization driving voltage provided at the node N1 by the negative polarization output circuit 24A is transmitted to the even output channel via the n-channel MOS transistor M1*b*, and the positive polarization driving voltage provided at the node N2 by the positive polarization output circuit 24B is transmitted to the odd output channel via the p-channel MOS transistor M2*b*, thereby switching the dot polarization at the odd and even channels and accomplish dot polarization inversion.

As a matter of fact, since the swing range of the negative polarization driving voltage, i.e. voltage swing range, is relatively low, n-channel MOS transistors are enough for polarization switching/transmitting control. Likewise, since the swing range of the positive polarization driving voltage is relatively high, p-channel MOS transistors are enough for polarization switching/transmitting control. Consequently, the layout size of the means for polarization switching in the output stage 22 may be reduced and the integrity of the source chip may be enhanced.

FIG. 2 illustrates examples of the output circuits 24A and 24B according to the present invention. The negative polarization output circuit 24A is disposed with a folded input stage 26A, a cascade stage 28A and an output driver 30A. The folded input stage 26A and cascade stage 28A are combined to form a stacking circuit 36A having a folded cascade structure. In consideration of the input signal $V_{IN}$1 with a lower swing range, the folded input stage 26A is implemented with a p-channel MOS transistor. Voltages Va and Vb are adequate bias voltages. The gate of the transistor Ma is used for receiving the input signal $V_{IN}$1, while the gate of the transistor Mb is coupled to the node N1. The cascade stage 28A outputs corresponding signals at nodes Na and Nb according to the signals received from the folded input stage 26A. In other words, the nodes Na and Nb can be considered as two front-stage output ends of the stacking circuit 36A. Correspondingly, the output driver 30A is disposed with a p-channel MOS transistor Mc and an n-channel MOS transistor Md. The gates of the transistors Mc and Md are considered as two drive input ends of the output driver 30A, which correspond to the nodes Na and Nb, respectively. When the output driver 30A receives signals from the node Na and Nb through the two drive signals ends, it is driven to generate a negative polarization driving voltage at the node N1. In the cascade stage 28A, a bias circuit 32A with bias voltages Vc and Vd are used for adjusting direct-current bias voltages at the node Na and Nb so as to form a class AB amplifier structure along with the driver circuit 30A. Meanwhile, the bias circuit 32A can also be considered as a load of the cascade stage 28A. Furthermore, a capacitor Ca is coupled between the node N1 and the cascade stage 28A for cascade Miller capacitance compensation.

Similar to the output circuit 24A, the output circuit 24B is disposed with folded input stage 26B, a cascade stage 28B and an output driver 30B; and the folded input stage 26B and cascade stage 28B are combined to form a stacking circuit 36B having a folded cascade structure. Since the signals associated with the output circuit 24B have a higher swing range, the circuitry of the output circuit 24B is slightly different from that of the output circuit 24A. In consideration of the input signal $V_{IN}$2 with a higher swing range, the folded input stage 26B is implemented with an n-channel MOS transistor. Voltages Ve and Vf are adequate bias voltages. The gate of the transistor Me is used for receiving the input signal $V_{IN}$2, while the gate of the transistor Mf is coupled to the node N2. The cascade stage 28B outputs corresponding signals at nodes Nc and Nd according to the signals received from the folded input stage 26B. In other words, the nodes Nc and Nd can be considered as two front-stage output ends of the stacking circuit 36B. Correspondingly, the output driver 30B is disposed with a p-channel MOS transistor Mg and an n-channel MOS transistor Mh. The gates of the transistors Mg and Mh are considered as two drive input ends of the output driver 30B, which correspond to the nodes Nc and Nd, respectively. When the output driver 30B receives signals from the node Nc and Nd through the two drive signals ends, it is driven to generate a positive polarization driving voltage at the node N2. In the cascade stage 28B, a bias circuit 32B with bias voltages Vg and Vh are used for adjusting direct-current bias voltages at the node Nc and Nd so as to form a class AB amplifier structure along with the driver circuit 30B. Meanwhile, the bias circuit 32B can also be considered as a load of the cascade stage 28B. Furthermore, a capacitor Cb is coupled between the node N2 and the cascade stage 28B for cascade Miller capacitance compensation.

In the embodiment of FIG. 2, each of the transistors in the output circuit 24A and 24B is implemented with an asymmetric device layout design. On the other hand, the transistors M1*a*-M1*b* and M2*a*-M2*b* are designed based on a symmetric device layout specification. According to an asymmetric device layout specification, the clearance between the source and gate of a MOS transistor and the clearance between the drain and gate of the MOS transistor are asymmetric or unequal. Such a design may reduce a layout size of the MOS transistor. If the clearance between the source and gate and the clearance between the drain and gate are symmetric or equal, the layout size is larger. As described above, a larger layout size has a better resistance to high voltage and high current as well as electrostatic discharge (ESD). Therefore, it is desired to use transistors with asymmetric layouts in a front section of the output stage, but use transistors with symmetric layouts in the last section of the polarization switching mechanism. In this way, a good balance between the layout size and the circuit integrity/durability can be achieved.

As discussed above, when the output stage does not need to output driving voltage through the odd/even output channels, the output stage may provide high impedance output at the odd/even output channels thereof. Examples of output stages capable of supporting a high-impedance mode are given and described hereinafter.

Figure 3:
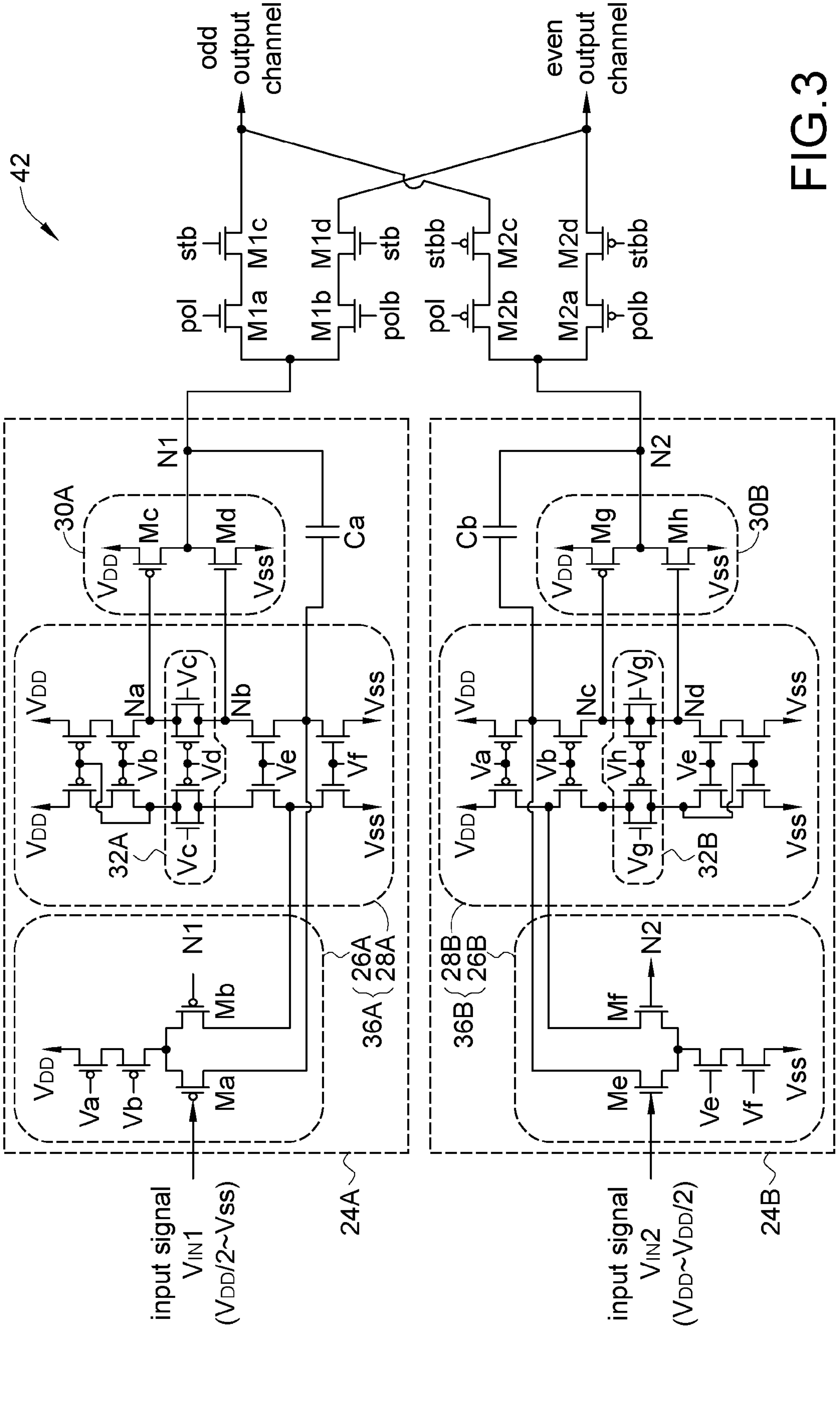
FIG. 3 is a circuit diagram illustrating an output stage of a source chip according to another embodiment of the present invention.

Please refer to FIG. 3, which illustrates another embodiment of an output stage 42 according to the present invention. The output stage 42 also includes output circuits 24A and 24B which further include folded input stages 26A and 26B, cascade stages 28A and 28B and output drivers 30A and 30B of FIG. 2. The dot polarization inversion can also be realized from the description of FIG. 2, and is not to be redundantly described herein. In order to be able to support the high-impedance mode, the output stage 42 are further disposed with two n-channel MOS transistors M1*c* and M1*d* and two p-channel MOS transistors M2*c* and M2*d*. The gates of the transistors M1*c* and M1*d* are controlled by a control signal stb, and the gates of the transistors M2*c* and M1*d* are controlled by another control signal stbb, wherein the control signal stb is a data strobe signal in this embodiment, and the control signals stb and stbb are phase-inversed signals. If the control signal stb is at a high level and thus the control signal stbb is at a low level, it indicates that the output stage 42 is enabled to alternately provide polarization-inverting voltage to the odd and even output channels. Then the high-level control signal stb (and low-level control signal stbb) turns on the transistors M1*c*, M1*d* and transistors M2*c*, M2*d* so as to alternately output the positive/negative polarization driving voltages to the odd and even output channels via the nodes N1 and N2. In contrast, if the control signal stb is switched to a low level and thus the control signal stbb is at a high level, it indicates that the output stage 42 is disabled from providing any driving voltage to the odd and even output channels, and instead, is required to provide high impedance. Then the low-level control signal stb (and high-level control signal stbb) turns off the transistors M1*c*, M1*d* and transistors M2*c*, M2*d* so as to result in an equivalent impedance associated with the odd/even output channels as a high impedance.

Since the output of the output circuit 24A is a negative polarization driving voltage with a relatively low swing range, only n-channel MOS transistors M1*c* and M1*d* are needed to control the switching to the high-impedance mode, just like the transistors M1*a* and M1*b*. Similarly, the output circuit 24B needs only p-channel MOS transistors M2*c* and M2*d* to control the switching to the high-impedance mode.

When practicing the output stage 42, each of the transistors in the output circuits 24A and 24B and the transistors M1*a*, M1*b*, M1*c* and Mid can be implemented with an asymmetric device layout design. On the other hand, the transistors M1*c*, M1*d*, M2*c* and M2*d* and the output circuits 24A and 24B can be designed based on a symmetric device layout specification. In other words, according to the present invention, transistors with a symmetric device layout are needed only at the last section of circuitry, e.g. the transistors M1*c*/M1*d* and M2*c*/M2*d* associated with the high-impedance switching mode, and the other circuits can be implemented with transistors with an asymmetric device layout. In this way, the chip integrity and the life span of the chip are both made optimal.

Figure 4:
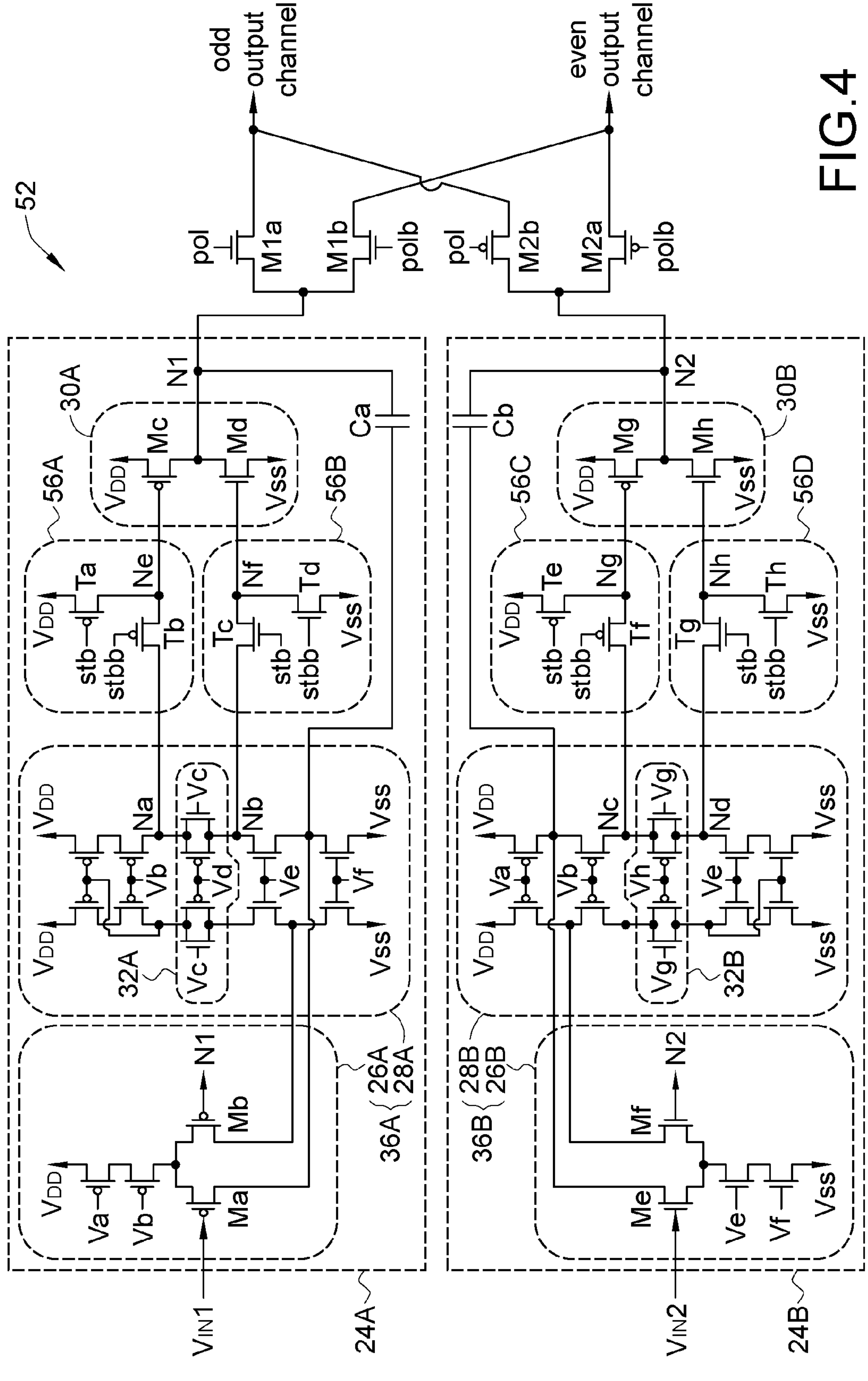
FIG. 4 is a circuit diagram illustrating an output stage of a source chip according to a further embodiment of the present invention.

In spite the output stage 42 as illustrated in FIG. 3 can enable a high-impedance mode, the disposition of the high-impedance switching mechanism at the output ends of the output drivers 30A and 30B possibly influences the property of the equivalent output impedance of the output drivers, such as a zero point in a frequency response or a slew rate. Therefore, for a compensation purpose, transistors with a larger layout size and higher resistance, e.g. higher conducting resistance between source and drain, can be used as the transistors M1*c*, M1*d*, M2*c* and M2*d*. Alternatively, the high-impedance switching mechanism can be arranged at input ends of the output drivers 30A and 30B, as shown in FIG. 4, to avoid the influence. The embodiment of the output stage 52 of FIG. 4 also includes output circuits 24A and 24B which further include folded input stages 26A and 26B, cascade stages 28A and 28B and output drivers 30A and 30B of FIG. 2, and the dot polarization inversion means including the transistors M1*a*, M1*b*, M2*a* and M2*b*. For supporting the high-impedance mode, the output stage 52 is disposed with switching circuits 56A-56D. As discussed above with reference to FIG. 2, the nodes Na and Nb are considered as two front-stage output ends of the stacking circuit 36A; the two gates (nodes Ne and Nf) of the output driver 30A are considered as two corresponding input ends; and the switching circuits 56A and 56B are respectively coupled between the nodes Na, Ne and the nodes Nb, Nf. Likewise, the nodes Nc and Nd are considered as two front-stage output ends of the stacking circuit 36B; the two gates (nodes Ng and Nh) of the output driver 30B are considered as two corresponding input ends; and the switching circuits 56C and 56D are respectively coupled between the nodes Nc, Ng and the nodes Nd, Nh.

Before the output stage 52 outputs the driving voltages, the above-described switching circuits conduct the front-stage output ends coupled thereto to corresponding driving input ends. Then the stacking circuits may output signals to corresponding output drivers to enable the output drivers to generate driving voltages. While the output stage is entering the high-impedance mode, the switching circuits couple the corresponding driving input ends to corresponding preset voltages, e.g. operational voltages $V_{DD}$ and $V_{SS}$, so that the output drivers suspend from work and high impedance can be provided at the nodes N1 and N2. As shown in FIG. 4, the switching circuit 56A is disposed with two p-channel MOS transistors Ta and Tb. The transistor Ta having its gate controlled by a control signal stb is used for controlling the conduction between the node Ne and the operational voltage $V_{DD}$. The transistor Tb having its gate controlled by a control signal stbb is used for controlling the conduction between the node Na and the node Ne. The switching circuit 56B is disposed with two n-channel MOS transistors Tc and Td. The transistor Tc having its gate controlled by the control signal stb is used for controlling the conduction between the node Nb and the node Nf; and the transistor Td having its gate controlled by the control signal stbb is used for controlling the conduction between the node Nf and the operational voltage $V_{SS}$.

As discussed above, the control signal Stb can be a data strobe signal, and the corresponding control signal Stbb can be an phase-inversed signal of the data strobe signal. When the output stage is going to output driving voltages, the signal stb should be at a high level while the signal stbb is at a low level. The high-level control signal stb (and low-level control signal stbb) turns on the transistors Tb, Tc, Tf and Tg while turning off the transistors Ta, Td, Te and Th, thereby allowing the signals from the stacking circuits 36A and 36B to be transmitted to the output drivers 30A and 30B in next stage. The output drivers 30A and 30B may provide normal negative and positive polarization driving powers to generate driving voltages. Meanwhile, the polarization switching mechanism implemented with the transistors M1*a*, M1*b*, M2*a* and M2*b* may perform polarization inversion alternately through the odd and even output channels. In contrast, when the output stage 52 is switched to the high-impedance mode, the control signal stb should be at a low level and thus the control signal stbb is at a high level. Therefore, the transistors Tb, Tc, Tf and Tg are turned off while the transistors Ta, Td, Te and Th are turned on. The conducting transistors Ta, Te, Td and Th conduct the gates of the p-channel MOS transistors Mc and Mg to the operational voltage $V_{DD}$, and conduct the gates of the n-channel MOS transistors Md and Mh to the operational voltage $V_{SS}$. Accordingly, the output drivers 30A and 30B will be turned off, and thus high impedance can be provided at the nodes N1 and N2, and even at the odd output channel and the even output channel.

In the embodiment of FIG. 4, the switching mechanism to/from the high-impedance mode (switching circuits 56A~56D) is disposed at the input ends of the output drivers 30A and 30B rather than the output ends. Therefore, the influence of the switching mechanism on the output impedance of the output drivers 30A and 30B at the nodes N1 and N2 can be avoided. Furthermore, as the response time of the switching circuits 56A~56D is sufficient under the driving time sequence of an LCD panel, the operational time sequence of the output stage 52 will not be affected.

In the output stage 52 of FIG. 4, each of the transistors in the output circuit 24A and 24B is implemented with an asymmetric device layout design. On the other hand, the transistors M1*a*, M1*b*, M2*a* and M2*b* are designed based on a symmetric device layout specification. Therefore, the transistors with asymmetric layouts are still only disposed in the last section of the polarization switching mechanism, e.g. the polarization switching transistors M1*a*/M1*b* and M2*a*/M2*b*. In this way, a good balance between the layout size, circuit integrity, device life span and ESD resistance can be achieved.

Figure 5:
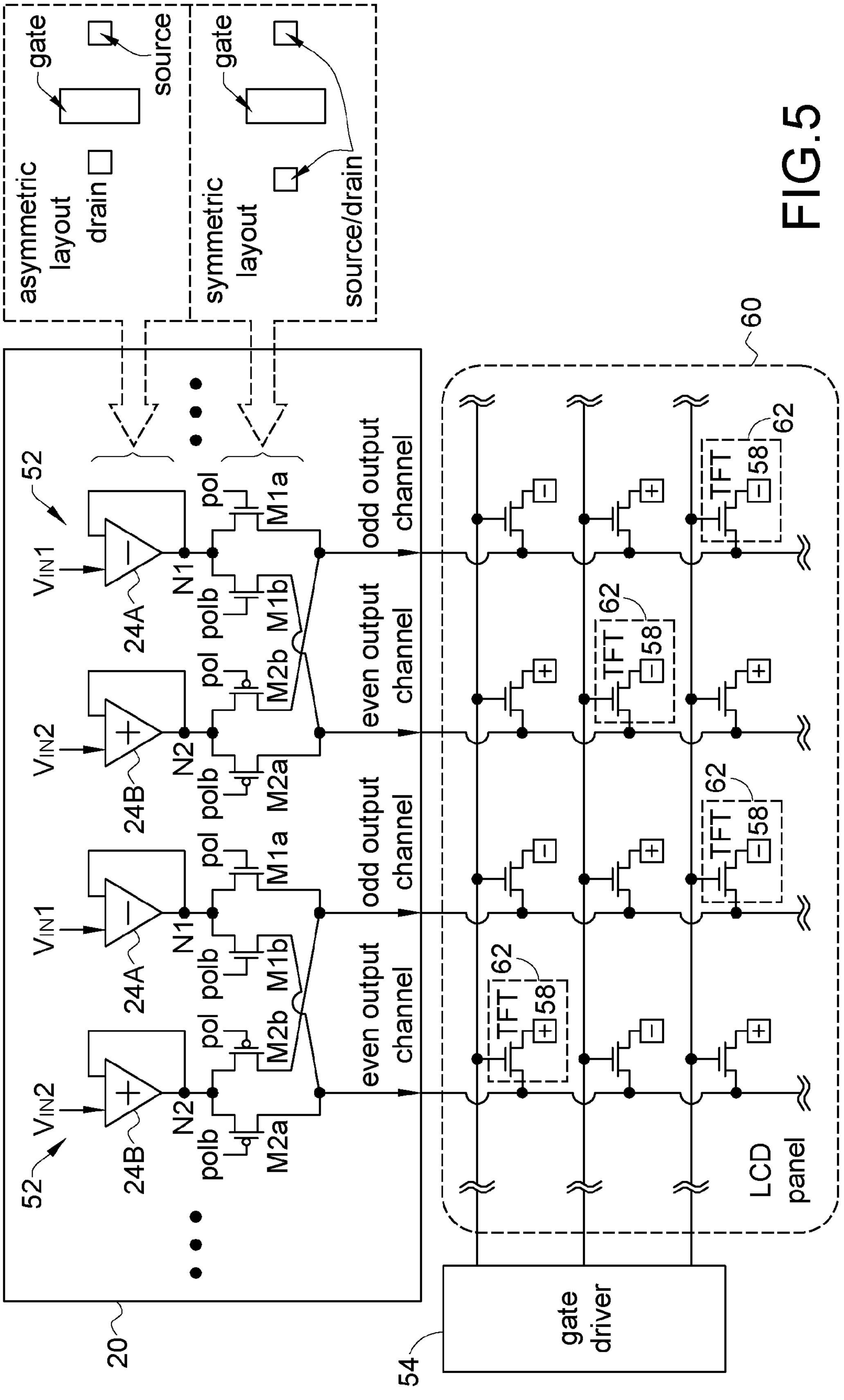
FIG. 5 is a circuit diagram illustrating the use of an output stage according to the present invention for driving an LCD panel.

Please refer to FIG. 5, which illustrates a source driver 20, e.g. a source chip, in which the output stage 52 can be used. The output stage 52 works with a gate driver 54 to drive an LCD panel 60, e.g. a TFTLCD panel. In the LCD panel 60, each of the thin film transistors combines with a corresponding LC light valve to form an LC unit 62, and the gates of the transistors are controlled by the gate driver 54. When specified thin film transistors are conducted, the positive/negative polarization driving voltages provided by the output stage 52 at the odd/even output channels can be transmitted to corresponding LC light valves 58 through these thin film transistors. The LC light valves 58 are thus able to show different brightness so as to display an image. Each of the LC light valves 58 as shown in FIG. 5 is annexed with a "+" or "−" sign to represent the positive/negative polarization of the LC light valve driven by dot polarization inversion. With dot polarization inversion, adjacent LC units are subjected to inversed polarization driving. Furthermore, the same LC unit is also updated, e.g. switched from a frame to next frame, with inversed polarization driving. The transistors M1*a*, M1*b* and M2*a*, M2*b* disposed in the output stage 52 alternately switch positive and negative polarization driving voltages at the odd and even output channels to support a variety of polarization inversion driving such as the above-mentioned dot polarization inversion driving.

FIG. 5 further illustrates the layout strategy of the output stage 52 according to the present invention. That is, transistors with a symmetric device layout are only used in the last section of the circuitry (i.e. polarization switching transistors M1*a*/M1*b* and M2*a*/M2*b*), while the other circuits may adopt transistors with an asymmetric device layout, so as to gain a balance among chip integrity, layout size, life span and ESD resistance.

To sum up, compared with prior art, the present invention provides better solutions for polarization switching mechanism and high-impedance mode mechanism of an output stage of a source chip in order to minimize layout size of the output stage and improve the integrity of the source chip without altering the output impedance response. Furthermore, the present invention provides a better layout strategy for the transistors used in the output stage.

While the invention has been described in terms of what is presently considered to be the most practical and preferred embodiments, it is to be understood that the invention needs not to be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An output stage adapted to be used in a source chip, comprising:

an odd output channel and an even output channel;

a first output circuit for providing a first output signal at a first node according to a first input signal;

a second output circuit for providing a second output signal at a second node according to a second input signal; and a plurality of first-type transistors and second-type transistors;

wherein one of the first-type transistors is coupled between the first node and the odd output channel so that the first output signal is transmitted to the odd output channel via the first-type transistor without passing through any of the second-type transistors; another one of the first-type transistors is coupled between the first node and the even output channel so that the first output signal is transmitted to the even output channel via the first-type transistor without passing through any of the second-type transistors; one of the second-type transistors is coupled between the second node and the odd output channel so that the second output signal is transmitted to the odd output channel via the second-type transistor without passing through any of the first-type transistors; and another one of the second-type transistors is coupled between the second node and the even output channel so that the second output signal is transmitted to the even output channel via the second-type transistor without passing through any of the first-type transistors.

2. The output stage according to claim 1 wherein the first output circuit includes:

a first stacking circuit outputting a corresponding signal from at least one front-stage output end according to the first input signal;

a first output driver coupled between the first stacking circuit and the first node, and having at least one driving input end corresponding to the front-stage output end of the first stacking circuit;

at least one switching circuit coupled between the front-stage output end and the corresponding driving input end, each of which conducts the front-stage output end coupled thereto to the corresponding driving input end so that the first output driver selectively outputs the first output signal from the first node or connects the driving input end to a corresponding preset voltage to provide high impedance at the first node.

3. The output stage according to claim 1 wherein the second output circuit includes:

a second stacking circuit outputting a corresponding signal from at least one front-stage output end according to the second input signal;

a second output driver coupled between the second stacking circuit and the second node, and having at least one driving input end corresponding to the front-stage output end of the second stacking circuit;

at least one switching circuit coupled between the front-stage output end and the corresponding driving input end, each of which conducts the front-stage output end coupled thereto to the corresponding driving input end so that the second output driver selectively outputs the second output signal from the second node or connects the driving input end to a corresponding preset voltage to provide high impedance at the second node.

4. The output stage according to claim 1 wherein the first-type transistors coupled between the first node and the odd output channel and the first-type transistors coupled between the first node and the even output channel are not turned on at the same time; and the second-type transistors coupled between the second node and the odd output channel and the second-type transistors coupled between the second node and the even output channel are not turned on at the same time.

5. The output stage according to claim 4 wherein the first-type transistors coupled between the first node and the odd output channel and the second-type transistors coupled between the second node and the even output channel are optionally turned on at the same time; and the first-type transistors coupled between the first node and the even output channel and the second-type transistors coupled between the second node and the odd output channel are optionally turned on at the same time.

6. The output stage according to claim 1 wherein a swing range of the first input signal is lower than a swing range of the second input signal; the first-type transistors are n-channel MOS transistors; and the second-type transistors are p-channel MOS transistors.

7. The output stage according to claim 1 wherein the first output circuit and the second output circuit are implemented based on an asymmetric device layout specification; and the first-type transistors and second-type transistors are implemented based on a symmetric device layout specification.

8. An output stage adapted to be used in a source chip, comprising:

at least one output circuit for providing an output signal at an output node according to an input signal, including:

a stacking circuit outputting a corresponding signal from at least one front-stage output end according to the input signal;

an output driver coupled between the stacking circuit and the second output node, and having at least one driving input end corresponding to the front-stage output end of the stacking circuit;

at least one switching circuit coupled between the front-stage output end and the corresponding driving input end, each of which conducts the front-stage output end coupled thereto to the corresponding driving input end so that the output driver selectively outputs the output signal from the output node or connects the driving input end to a corresponding preset voltage to provide high impedance at the output node.

9. The output stage according to claim 8 wherein the at least one output circuit include a first output circuit and a second output circuit, and the output stage further comprises:

an odd output channel and an even output channel; and a plurality of first-type transistors and second-type transistors;

wherein the output node of the first output circuit is coupled to the odd output channel and the even output channel via the first-type transistors so that the output node of the first output circuit is communicable with either of the odd output channel and the even output channel with or without the conduction of any of the second-type transistors; and the output node of the second output circuit is coupled to the odd output channel and the even output channel via the second-type transistors so that the output node of the second output circuit is communicable with either of the odd output channel and the even output channel with or without the conduction of any of the first-type transistors.

10. The output stage according to claim 9 wherein a swing range of the first input signal is lower than a swing range of the second input signal; the first-type transistors are n-channel MOS transistors; and the second-type transistors are p-channel MOS transistors.

11. The output stage according to claim 9 wherein the first output circuit and the second output circuit are implemented based on an asymmetric device layout specification; and the first-type transistors and second-type transistors are implemented based on a symmetric device layout specification.

12. A method for driving polarization inversion of a first output driver and a second output driver at an odd output channel and an even output channel while performing source driving, the method comprising:

controlling conduction states among the first output driver, the second output driver, the odd output channel and the even output channel with a plurality of first-type transistors and second-type transistors;

wherein the first output driver is made communicable with either of the odd output channel and the even output channel by conducting the first-type transistors with or without the conduction of any of the second-type transistors; and the second output driver is made communicable with either of the odd output channel and the even output channel by conducting the second-type transistors with or without the conduction of any of the first-type transistors.

13. The method according to claim 12 wherein the first-type transistors are n-channel MOS transistors; the second-type transistors are p-channel MOS transistors; and the method further comprises:

driving a signal with a relatively low swing range by the first output driver, and driving a signal with a relatively high swing range by the second output driver.

14. The method according to claim 12 further comprising:

connecting an input end of the first output driver or the second output driver to a corresponding preset voltage to provide high impedance at an output end of the first output driver or the second output driver.

* * * * *